United States Patent [19]
Nishimura et al.

[11] Patent Number: 5,296,737
[45] Date of Patent: Mar. 22, 1994

[54] SEMICONDUCTOR DEVICE WITH A PLURALITY OF FACE TO FACE CHIPS

[75] Inventors: Asao Nishimura, Ushiku; Makoto Kitano, Tsuchiura; Akihiro Yaguchi, Ibaraki; Nae Yoneda, Ibaraki; Ryuji Kohno, Ibaraki; Gen Murakami, Tama; Ichiro Anjoh, Koganei, all of Japan

[73] Assignee: Hitachi, Ltd., Tokyo, Japan

[21] Appl. No.: 755,655

[22] Filed: Sep. 6, 1991

Related U.S. Application Data

[63] Continuation-in-part of Ser. No. 713,100, Jun. 11, 1991.

[30] Foreign Application Priority Data

Sep. 6, 1990 [JP] Japan .................. 2-236711

[51] Int. Cl.$^5$ ............................ H01L 23/28
[52] U.S. Cl. ..................... 257/673; 257/723; 257/737; 257/787
[58] Field of Search ......... 357/70, 75, 84, 72, 357/74; 257/723, 737, 773, 787, 673, 676

[56] References Cited

U.S. PATENT DOCUMENTS

| | | | |
|---|---|---|---|
| 3,893,158 | 7/1975 | Lincoln | 357/70 |
| 4,541,003 | 9/1985 | Otsuka et al. | 357/74 |
| 4,763,188 | 8/1988 | Johnson et al. | 357/74 |
| 4,862,322 | 8/1989 | Bickford et al. | 357/75 |
| 5,025,306 | 6/1991 | Johnson et al. | 357/75 |
| 5,070,390 | 12/1991 | Shimizu | 257/787 |

FOREIGN PATENT DOCUMENTS

| | | |
|---|---|---|
| 0221496 | 10/1986 | European Pat. Off. . |
| 0340527 | 4/1989 | European Pat. Off. . |
| 0379592 | 6/1989 | European Pat. Off. . |
| 58-159361 | 9/1983 | Japan . |

*Primary Examiner*—Rolf Hille
*Assistant Examiner*—Roy Potter
*Attorney, Agent, or Firm*—Antonelli, Terry, Stout & Kraus

[57] ABSTRACT

A semiconductor device comprises a plurality of semiconductor chips; electrodes formed on circuit surfaces of said plurality of semiconductor chips; inner leads made of a metal foil and bonded at first ends thereof to the electrodes, outer leads each having a predetermined surface at a first end thereof bonded to a second end of at least one of the inner leads, and a sealing material sealing said plurality of semiconductor chips, the electrodes, the inner leads, and part of each of the outer leads. The semiconductor chips are laminated in such a manner that those surfaces of the semiconductor chips on which their respective circuits are formed are disposed in facing relation to each other. This provides a semiconductor device which is excellent in assembling efficiency.

20 Claims, 7 Drawing Sheets

SEMICONDUCTOR DEVICE WITH A PLURALITY OF FACE TO FACE CHIPS

CROSS REFERENCE TO RELATED APPLICATION

This is a continuation-in-part of U.S. patent application Ser. No. 07/713100 filed on Jun. 11, 1991.

BACKGROUND OF THE INVENTION

1. Field of the Invention

This invention relates to a plastic-molded-type semiconductor device, and more particularly to a semiconductor device suitable for integrally sealing a plurality of semiconductor chips at a high density.

2. Description of the Prior Art

As conventional methods of enhancing the degree of integration of semiconductor chips in a plastic-molded-type semiconductor device having a limited external size, there are known a method, as disclosed in Japanese Patent Unexamined Publication No. 62-109333, in which semiconductor chips are attached to opposite sides of one lead frame, and they are integrally joined together by plastic molding, and a method, as disclosed in Japanese Patent Unexamined Publication Nos. 57-148362 and 62-119952, in which a plurality of lead frames each having a semiconductor chip attached to only one side thereof are stacked, and are integrally joined together by plastic molding.

With respect to the above prior art method of mounting the semiconductor chips on both sides of the lead frame, electrodes on the surface of the semiconductor chip on one side of the lead frame are wire-bonded to the leads of the lead frame, using fine metal wires, and then after the lead frame is inverted, the wire bonding of the semiconductor chip on the other side of the lead frame must be done. Thus, two separate wire bondings, must be performed, which increases the number of production steps, and besides the side of the lead frame already subjected to the wire bonding is fixedly supported on a support bed, and in this condition the wire bonding of the other side is performed. Therefore, there has been encountered a problem that the fine metal wires on the side first subjected to the wire bonding are deformed, so that the fine metal wires are contacted with each other or are broken.

On the other hand, with respect to the method using the plurality of lead frames, the lead frames are connected together by spot welding or the like before the resin molding is carried out. Then, the resin molding is carried out using a two-split type mold used for holding an ordinary lead frame therebetween from upper and lower sides, or the resin molding must be performed using an at least three-split type mold of a complicated structure capable of dealing with a plurality of lead frames. In either case, there has been encountered a problem that the efficiency of the assembling operation is lowered.

Further, in the method disclosed in Japanese Patent Unexamined Publication No. 62-109333, in which the wire bonding is used for connecting the semiconductor chips to the lead, the fine metal wires for each of the laminated semiconductor chips are connected in a curved manner resembling a mountain, so that a certain height must be secured, which results in a problem that the overall thickness of the semiconductor device can not be reduced.

SUMMARY OF THE INVENTION

It is an object of this invention to provide a semiconductor device which is excellent in assembling efficiency, and has a plurality of semiconductor chips laminated at a high density and integrally sealed.

The above object has been achieved by a semiconductor device comprising a plurality of semiconductor chips; electrodes formed on circuit surfaces of said plurality of semiconductor chips; inner leads made of a metal foil and bonded at one ends thereof to said electrodes; outer leads bonded at one ends thereof to the other ends of said inner leads; and a sealing material sealing said plurality of semiconductor chips, said electrodes, said inner leads, and part of each of said outer leads; wherein said semiconductor chips are laminated in said a manner that those surfaces of said semiconductor chips on which their respective circuits are formed are disposed in facing relation to each other.

The above object has been achieved by a semiconductor device comprising a plurality of semiconductor chips; electrodes formed on circuit surfaces of said plurality of semiconductor chips; inner leads made of a metal foil and bonded at one ends thereof to said electrodes; outer leads bonded at one ends thereof to the other ends of said inner leads; and a sealing material sealing said plurality of semiconductor chips, said electrodes, said inner leads, and part of each of said outer leads; wherein said semiconductor chips are laminated in such a manner that those surfaces of said semiconductor chips on which their respective circuits are not formed are disposed in facing relation.

The above object has been achieved by a semiconductor device comprising a plurality of semiconductor chips; electrodes formed on circuit surfaces of said plurality of semiconductor chips; inner leads made of a metal foil and bonded at one ends thereof to said electrodes; outer leads bonded at one ends thereof to the other ends of said inner leads; and a sealing material sealing said plurality of semiconductor chips, said electrodes, said inner leads, and part of each of said outer leads; wherein said semiconductor chips are laminated in such a manner that that surface of one of any two adjacent semiconductor chips on which a circuit is formed is disposed in facing relation to that surface of the other semiconductor chip on which a circuit is not formed.

The above object has been achieved by the construction in which said semiconductor chips are laminated in such a manner that the positions of said semiconductor chips are displaced with respect to each other.

The above object has been achieved by a semiconductor device comprising a plurality of semiconductor chips; electrodes formed on circuit surfaces of said plurality of semiconductor chips; inner leads made of a metal foil and bonded at one ends thereof to said electrodes; outer leads bonded at one ends thereof to the other ends of said inner leads; and a sealing material sealing said plurality of semiconductor chips, said electrodes, said inner leads, and part of each of said outer leads; wherein two said semiconductor chips having the same circuit construction are laminated; and said inner leads of said different semiconductor chips are bonded commonly to said outer leads.

With the above construction, the inner leads of the semiconductor chips can be all bonded to one surfaces of the outer leads, and therefore the inner leads of the lower semiconductor chip are bonded to the outer leads, and then the inner leads of the upper semiconductor chip can be bonded to the outer leads. Therefore, the step of inverting the lead frame is not needed, and since ordinary two-split type mold can be used at the sealing step, the efficiency of the assembling operation can be improved.

Further, the inner leads made of a metal foil are disposed at a height generally equal to that of the circuit surface of the semiconductor chip, and are extended horizontally to be bonded to the outer leads. Therefore, the thickness of the semiconductor device is reduced.

DETAILED DESCRIPTION OF THE PREFERRED EMBODIMENTS

Embodiments of the present invention will now be described with reference to the drawings.

Figure 1:
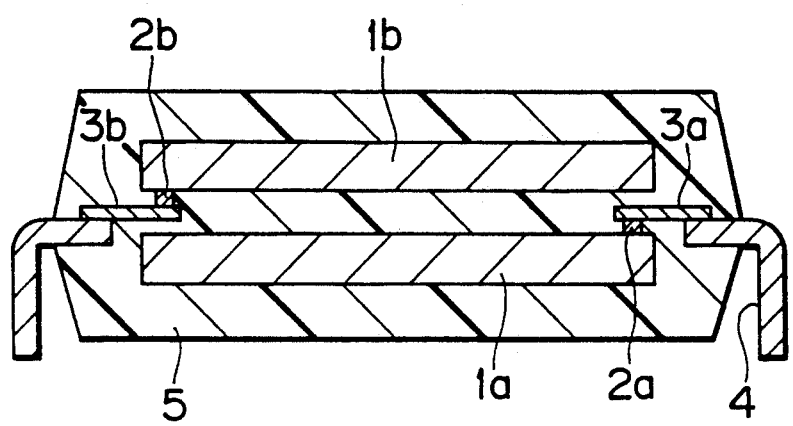
FIG. 1 is a cross-sectional view of a plastic-molded-type semiconductor device according to one embodiment of the present invention.

FIG. 1 is a cross-sectional view of a plastic-molded-type semiconductor device according to one embodiment of the present invention. Inner leads 3a and 3b made of a metal foil are thermally press-connected through respective bumps 2a and 2b (made of gold, solder or the like) respectively to electrodes provided on circuit-forming surfaces of two semiconductor chips 1a and 1b. The two semiconductor chips 1a and 1b having the respective inner leads 3a and 3b are laminated, with their circuit-forming surfaces facing each other. The inner leads 3a and 3b are thermally press-connected respectively to selected surfaces of outer leads 4 at a region outside of that region where the inner leads 3a and 3b are disposed between the two semiconductor chips 1a and 1b. These parts are molded in a sealing resin 5 except for external electrical connection portions of the outer leads 4.

Figure 2:
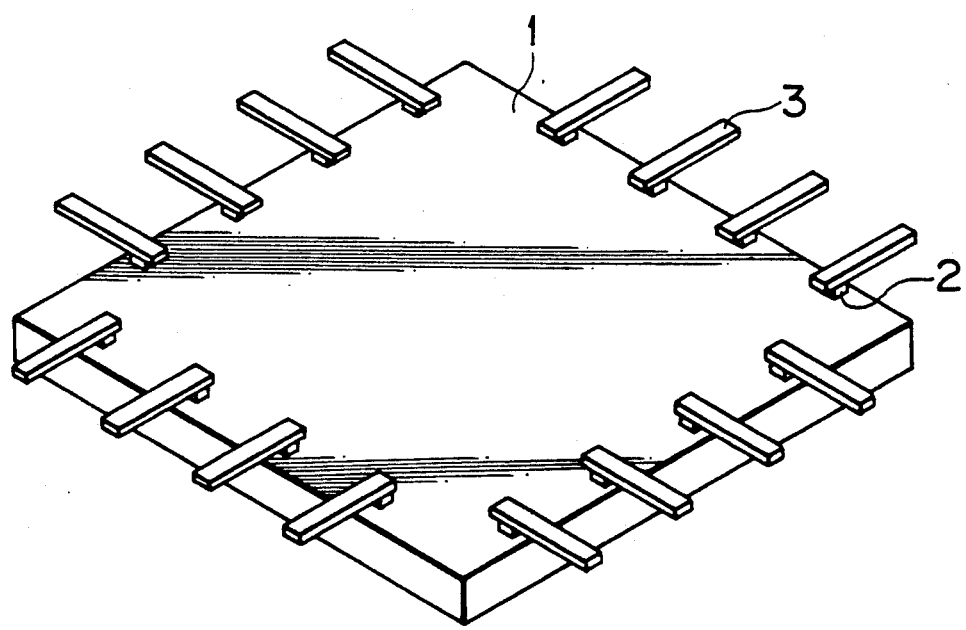
FIG. 2 is a perspective view showing a condition in which inner leads are attached to a semiconductor chip during the assembling of the plastic-molded-type semiconductor device of FIG. 1.

As shown in FIG. 2, for assembling this plastic-molded-type semiconductor device, first, the inner leads 3 are attached to each of the semiconductor chips 1. The bumps 2 for connecting the inner leads 3 may be formed beforehand on the electrodes of the semiconductor chip 1 by plating, thermal press-connection or the like, in which case the inner leads 3 are thermally press-connected onto these bumps, respectively. Alternatively, in contrast with this, the bumps 2 may be formed respectively on the inner leads 3, in which case these bumps are thermally press-connected to the electrodes of the semiconductor chip 1.

The inner leads 3 are formed from a foil of copper, copper alloy or other metal (having a thickness of about 10 $\mu$m to about 100 $\mu$m) by etching or pressing. Using only the metal foil, the inner leads 3 may be formed integrally with an outer frame portion in such a manner that the inner leads 3 are interconnected at a region outwardly of their outer ends shown in FIG. 2, in which case after the inner leads are connected to the semiconductor chip 1, the outer frame portion is cut off. Alternatively, a material may be used which has a pattern of a metal foil bonded to a polymeric film of polyimide, glass epoxy or the like, in which case unnecessary portions thereof are cut off after the bonding to the semiconductor chip 1. In the case of using the polymeric film, the resin molding may be performed in such a manner that the polymeric film remains bonded to the inner leads 3 except for those portions of the inner leads 3 bonded to the outer leads 4 or the semiconductor chip 1. In any case, the bonding can be easily carried out by an ordinary TAB (tape automated bonding) technique.

Figure 3:
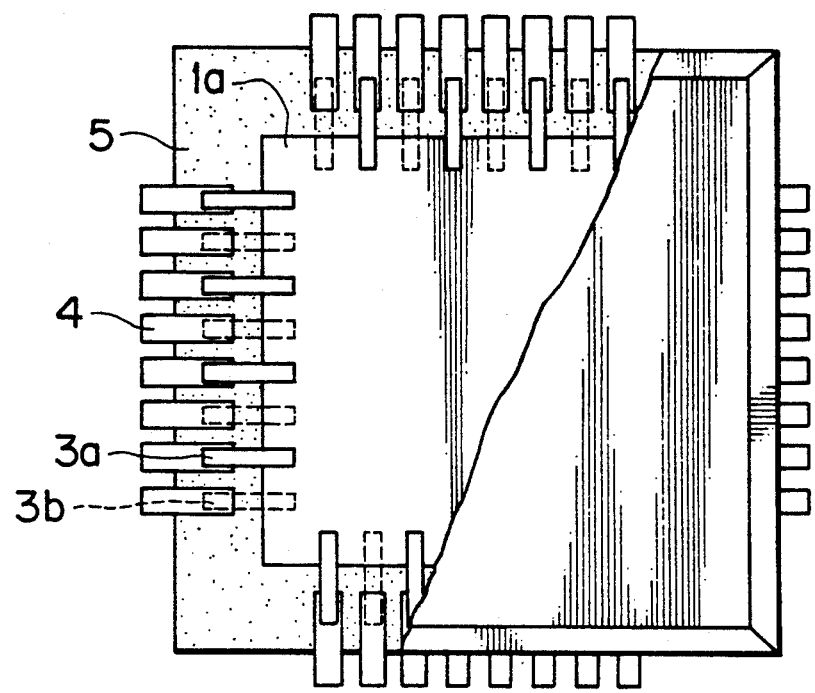
FIG. 3 is a partly cross-sectional, plan view showing the manner of connecting the inner leads within the plastic-molded-type semiconductor device of FIG. 1.

A method of laminating the two semiconductor chips 1 having the inner leads 3 attached thereto, and connecting them to the outer leads 4 will now be described with reference to FIG. 3. This Figure is a partly cross-sectional, plan view of the resin-sealed type semiconductor device of FIG. 1, with that portion disposed above the inner leads 3a bonded to the lower semiconductor chip 1a of FIG. 1 being partly removed. Broken lines indicate the positions of the inner leads 3b. The positions of the electrodes for mounting the inner leads 3a of the lower semiconductor chip 1a illustrated are displaced respectively from the positions of the electrodes for mounting the inner leads 3b of the upper semiconductor chip 1b (not illustrated) so that the inner leads 3a and 3b will not overlap each other vertically. Until the molding is performed by the sealing resin 5, the outer leads 4 are integral with a common outer frame (not shown) to form a lead frame, and these parts are made from a thin sheet of copper, copper alloy, iron-nickel alloy or other material (having a thickness of about 100 $\mu$m to about 500 $\mu$m) by etching, pressing or other means. The two semiconductor chips 1a and 1b to which the inner leads 3a and 3b are attached, respectively, are stacked in such a manner that their circuit-forming surfaces face each other, and the inner leads 3a and 3b are so positioned as to be disposed on the upper surfaces of the corresponding outer leads 4, respectively. Since the inner leads 3a and 3b are all in contact with one surfaces of the respective outer leads 4, the inner leads can be all bonded to the respective outer leads 4 simultaneously at one time by thermal press-connecting, soldering or other means. Also, in the case of bonding the inner leads one by one, or one row after another, the bonding can be carried out easily without inverting the lead frame. After the inner leads 3a and 3b are bonded to the respective outer leads 4, the outer frame portion of the lead frame is clamped between upper and lower portions of a low-split type mold, and the sealing resin 5 is transfer-molded. After this assembly is removed from the mold, the outer frame portion of the lead frame and so on are cut off, and those portions of the outer leads 4 extending exteriorly of the sealing resin 5 are bent into a predetermined shape.

In this embodiment, the two semiconductor chips 1a and 1b are merely disposed in a stacked condition, and are not adhesively bonded together until the molding is performed by the sealing resin 5. In this case, the gap between the two semiconductor chips 1a and 1b is filled with the sealing resin 5 when effecting the resin molding, so that an electrical insulation between the two semiconductor chips 1a and 1b, as well as a moisture resistance, is secured. When the two semiconductor chips 1a and 1b are to be stacked, a liquid-like resin such as an epoxy resin and a silicone resin, or silicone rubber, or a silicone gel, may be beforehand coated or applied by dropping to the surface of each of the semiconductor chips 1a and 1b, in which case such a material is cured after the stacking, or the stacking is effected after the curing of such a material. In these cases, higher insulation and moisture resistance can be obtained as compared with the case where the semiconductor chips 1a and 1b are merely stacked, and further in the case where the liquid-like resin is cured after the stacking, a higher positioning accuracy can also be obtained.

In this embodiment, the bonding of the inner leads 3a and 3b to the outer leads 4 can be done at only one side of the lead frame, and besides the conventional two-split type mold which can be handled easily can be used. Therefore, the efficiency of the assembling operation is enhanced. Further, the height required for connection of the two semiconductor chips to the outer leads is generally equal to the thickness of one layer of the inner leads, and this achieves the effect that the overall thickness of the plastic-molded-type semiconductor device is reduced.

Figure 4:
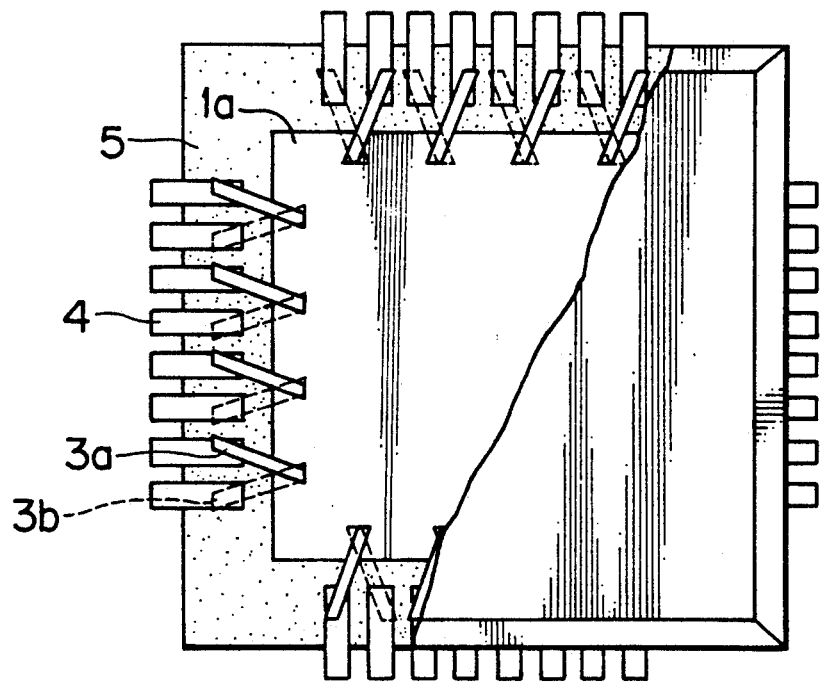
FIG. 4 is a partly cross-sectional, plan view showing the manner of connecting inner leads within a plastic-molded-type semiconductor device according to another embodiment of the present invention.
Figure 5:
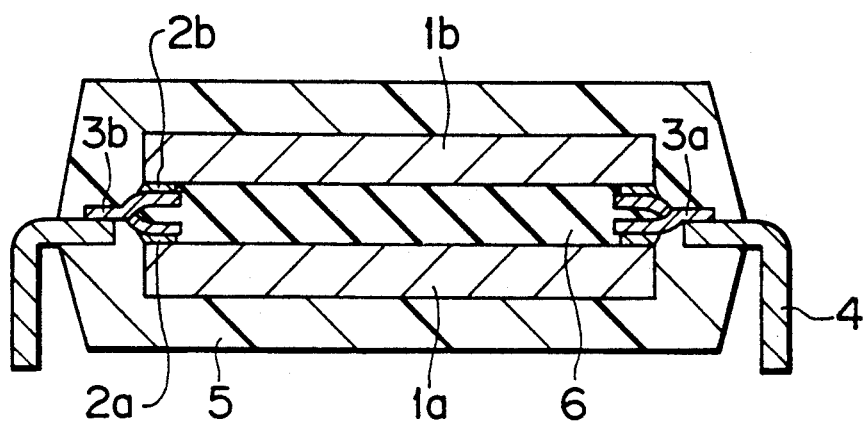
FIG. 5 is a cross-sectional view of the plastic-molded-type semiconductor device of FIG. 4.

FIG. 4 is a partly cross-sectional, plan view of a plastic-molded-type semiconductor device according to another embodiment of the present invention, with that portion disposed above inner leads 3a bonded to a lower semiconductor chip 1a being partly removed. In this figure as shown in FIG. 3, the inner leads 3a of the lower semiconductor chip 1a are indicated by solid lines, and broken lines indicate the positions of inner leads 3b of an upper semiconductor chip 1b. In this embodiment, each mating pair of inner leads 3a and 3b of the upper and lower semi-conductor chips 1b and 1a are attached respectively to the electrodes disposed at the same position. Each pair of vertically-overlapped inner leads 3a and 3b are extended in different directions, respectively, and are connected to different outer leads 4, respectively. In this case, since it is necessary to electrically insulate the upper and lower inner leads 3b and 3a from each other, an insulating resin 6 for insulating purposes is interposed between the upper and lower semiconductor chips 1b and 1a when stacking the upper and lower semiconductor chips, as cross-sectionally shown in FIG. 5. In this embodiment, there is achieved an effect that the positions of the electrodes of the upper and lower semiconductor chips 1b and 1a can be in common with each other.

Figure 6:
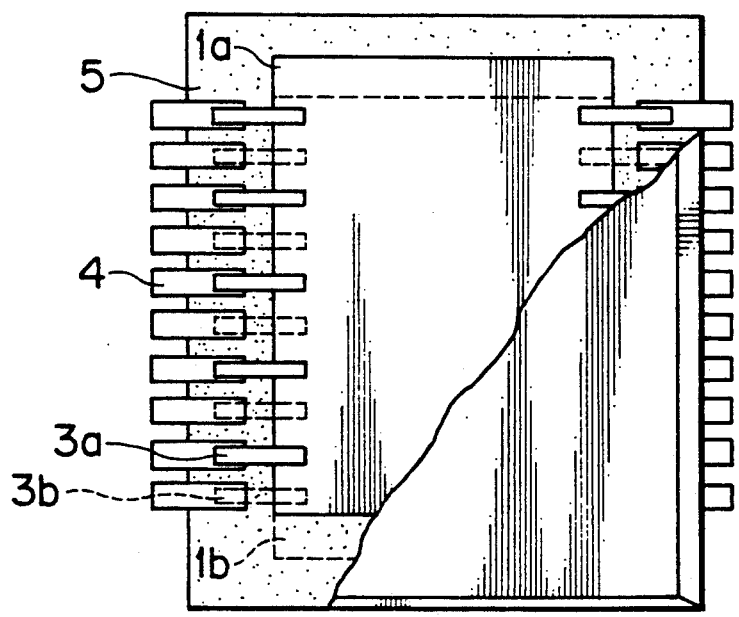
FIGS. 6 to 9 are partly cross-sectional, plan views showing the manner of connecting inner leads within plastic-molded-type semiconductor devices according to further embodiments of the present invention, respectively.

FIG. 6 is a partly cross-sectional, plan view of a plastic-molded-type semiconductor device according to a further embodiment of the present invention, with that portion disposed above inner leads 3a bonded to a lower semiconductor chip 1a being partly removed. In this Figure, broken lines indicates the positions of inner leads 3b of an upper semiconductor chip 1b, and the upper semiconductor chip 1b is also indicated by broken lines. In this embodiment, the inner leads 3a and 3b are attached to electrodes provided along two pairs of opposed sides of the two semiconductor chips 1a and 1b of a square shape. The positions of mounting of the inner leads 3a on the semiconductor chip 1a are the same as the positions of mounting of the inner leads 3b on the semiconductor chip 1b, respectively. The semiconductor chips 1a and 1b are semiconductor chip 1a are the same as the positions of mounting of the inner leads 3b on the semiconductor chip 1b, respectively. The semiconductor chips 1a and 1b are stacked in slightly displaced relation to each other in the direction of arrangement of the inner leads 3a and 3b so that the inner leads 3a and 3b will not overlap each other. In this embodiment, the positions of the electrodes of the upper and lower semiconductor chips 1b and 1a, as well as the shapes of the inner leads 3a and 3b, can be in common with each other. And besides, the inner leads 3a and 3b do not overlap each other, and therefore there is achieved an advantage that the overall thickness of the semiconductor device can be reduced.

Figure 7:
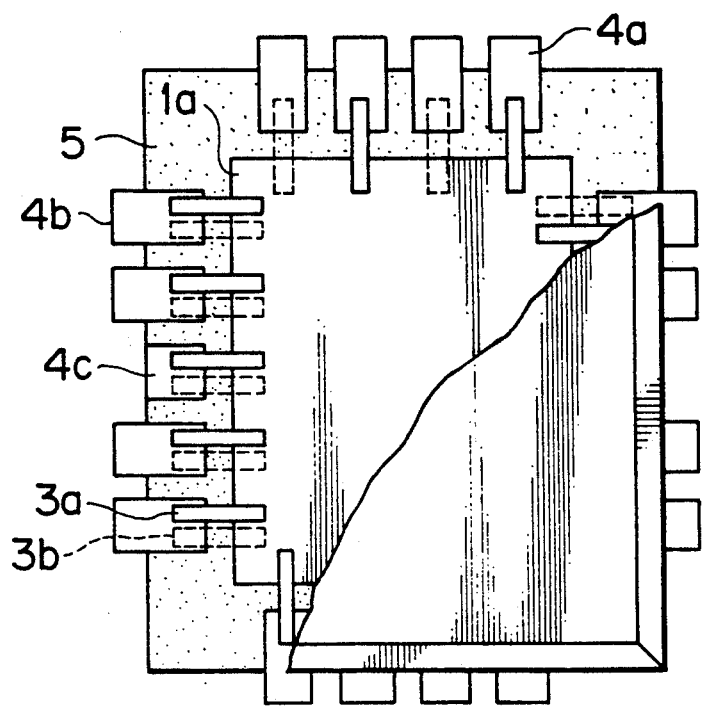

FIG. 7 is a partly cross-sectional, plan view of a plastic-molded-type semiconductor device according to a still further embodiment of the present invention, with that portion disposed above inner leads 3a bonded to a lower semiconductor chip is being partly removed. The positions of inner leads 3b of an upper semiconductor chip 1b are indicated by broken lines. In this embodiment, the two semiconductor chips 1a and 1b use their exclusive outer leads 4a, and some other outer leads 4b are common to the semiconductor chips 1a and 1b. Further, the other leads 4c are used only for interconnecting the semiconductor chips 1a and 1b, and are not extended exteriorly of a sealing resin 5. In this embodiment, the inner leads 3a and 3b are thus connected to the outer leads 4a, 4b and 4c, and therefore the outer leads 4 can be used commonly by the semiconductor chips 1a and 1b, and also can interconnect the semiconductor chips. In this case, if all of the outer leads 4 are used as the interconnection leads 4c, this is meaningless in view of the function of the semiconductor device; however, with respect to a combination other than this, the exclusive-use outer leads 4a, the common outer leads 4b and the interconnection outer leads 4c may be suitably combined.

Figure 8:
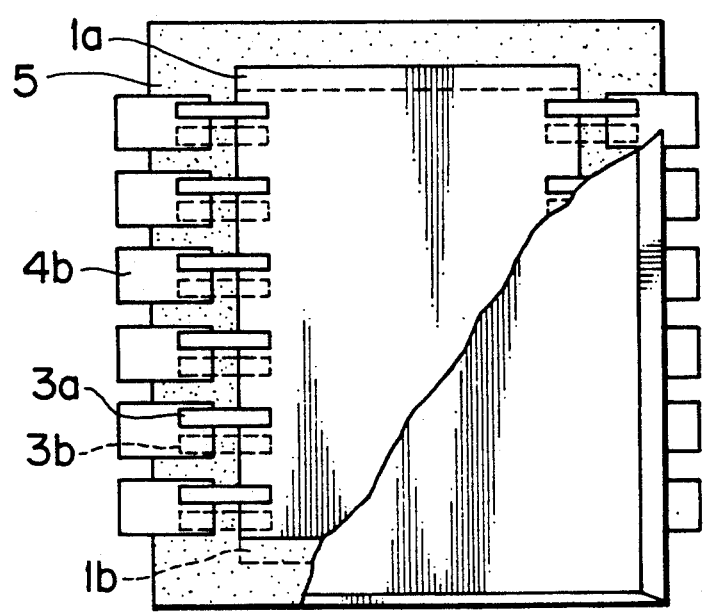

FIG. 8 is a partly cross-sectional, plan view of a plastic-molded-type semiconductor device according to a still further embodiment of the present invention, with that portion disposed above inner leads 3a bonded to a lower semiconductor chip 1a being partly removed. The position of an upper semiconductor chip 1b and the positions of inner leads 3b are indicated by broken lines. In this embodiment, electrodes of the upper and lower semiconductor chips 1b and 1a are arranged in mirror-surface symmetrical relation, and when circuit-forming surfaces of these chips are disposed in facing relation to each other, the electrodes of the same function face each other at the same position. The semiconductor chips 1a and 1b are stacked in slightly displaced relation to each other in the direction of arrangement of the inner lead 3a and 3b so that the inner leads 3a and 3b will not overlap each other. Each pair of inner leads 3a and 3b of the upper and lower semiconductor chips 1b and 1a are bonded to a common outer lead 4b. In this embodiment, if the semiconductor chips 1a and 1b are respectively two memory elements having the same circuit construction, there can be easily produced a plastic-molded-type semiconductor device which has an external size generally equal to that of a device having one semiconductor chip, but has a double memory capacity, and has a wire connection to the exterior similar to that of a device having one semiconductor chip. In this case, also, depending on the circuit construction of the semiconductor chips 1a and 1b and the type of input and output signals, outer leads 4a for exclusive use by the semiconductor chips 1a and 1b and the type of input and output signals, outer leads 4a for exclusive use by the semiconductor chips 1a and 1b, as well as outer leads 4c which are not extended exteriorly of a sealing resin 5 and interconnects the semiconductor chips 1a and 1b, may be used in combination, as shown in FIG. 7.

Figure 9:
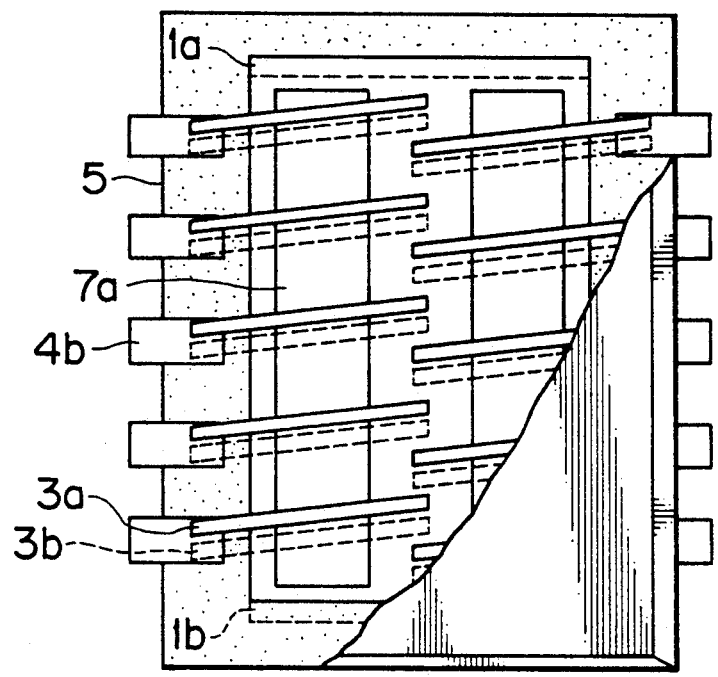
Figure 10:
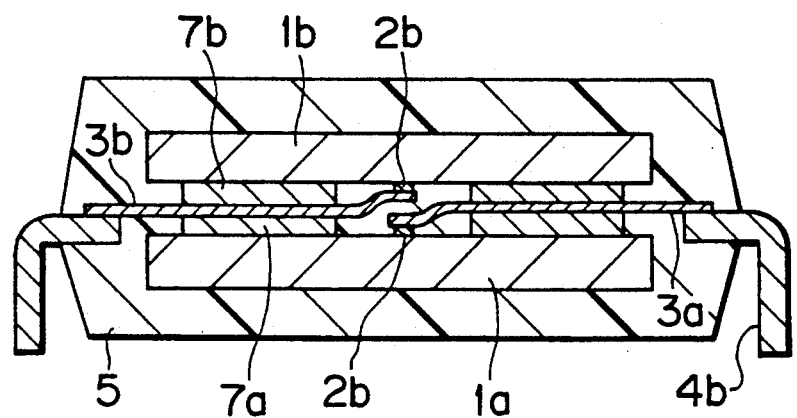
FIG. 10 is a cross-sectional view of the plastic-molded-type semiconductor device of FIG. 9.

FIG. 9 is a partly cross-sectional, plan view of a plastic-molded-type semiconductor device according to a still further embodiment of the present invention, with that portion disposed above inner leads 3a bonded to a lower semiconductor chip 1a being partly removed. The position of an upper semiconductor chip 1b and the positions of inner leads 3b are indicated by broken lines. FIG. 10 is a cross-sectional view of the plastic molded-type semiconductor device of FIG. 9. Electrodes of each of the semiconductor chips 1a and 1b are disposed in a row at a central portion of the semiconductor chip, and the electrodes of the two semiconductors are arranged in the same manner. The inner leads 3a and 3b are bonded via respective bumps 2 to the electrodes provided at the central portions of the semiconductor chips 1a and 1b, and are extended exteriorly of the sides of the semiconductor chips 1a and 1b. Polymeric films 7a and 7b are beforehand bonded to the lower inner leads 3a and the upper inner leads 3b, respectively, so as to prevent the deformation of the inner leads 3a and 3b and also to prevent an increase of an electrostatic capacity caused by the approach of the inner leads 3a and 3b toward each other. The two semiconductor chips 1a and 1b are stacked in slightly displaced relation to each other in the direction of arrangement of the inner leads 3a and 3b so that the inner leads 3a and 3b will not overlap each other. Each pair of inner leads 3a and 3b of the upper and lower semiconductor chips 1b and 1a are bonded to a common outer lead 4b.

In this embodiment, the electrodes of each of the semiconductor chips 1a and 1b are arranged in a row at the central portion, and therefore without preparing two kinds of semiconductor chips whose electrodes are disposed in mirror-surface symmetrical relation, the mirror-surface connection of the inner leads can be performed by the use of two semiconductor chips of the same construction.

Preferably, each of the polymeric films 7a and 7b bonded to the inner leads 3a and 3b is a film of polyimide, glass epoxy or the like having a thickness of about 10 μm to 200 μm. The film may be like a so-called TAB tape having a metal foil bonded to a substrate of a polymeric film. Polymeric films 7a and 7b of a required size may be bonded to predetermined portions of metal foil tapes having patterns of the inner leads 3a and 3b. Further, if it is intended only to reduce the electrostatic capacity between the semiconductor chips 1a and 1b and the inner leads 3a and 3b, the polymeric films 7a and 7b may not be bonded to the inner leads 3a and 3b, but may be bonded to the circuit-forming surfaces of the semiconductor chips 1a and 1b, or a similar polymeric material may be coated to each circuit-forming surface.

In so far as the areas covered by the polymeric films 7a and 7b are within the region molded by as sealing resin 5, these films may cover a wide area except for those portions of the inner leads 3a and 3b bonded to the semiconductor chips 1a and 1b and the outer leads 4b, and in contrast, these films may cover only part of the gap between the inner leads 3a and 3b and the semiconductor chips 1a and 1b. In the case where the sealing resin 5 is flowed into the gap between the stacked semiconductor chips 1a and 1b for resin molding purposes, it is preferred that the polymeric films 7a and 7b should have a minimum size so as to reduce the resistance to the flow of the sealing resin 5.

In the embodiment of FIG. 9, the upper and lower semiconductor chips 1b and 1a are displaced with respect to each other to thereby prevent the inner leads 3a and 3b from overlapping each other; however, even if the positions of the electrodes vertically overlap each other, the inner leads 3a and 3b can, of course, be connected to respective common leads 4b by changing the direction of extending of the upper and lower inner leads 3b and 3a, as in the embodiment of FIG. 4. Also, although there is not obtained the effect that the semiconductor chips of the same construction can not be used, there can be used two kinds of semiconductor chips 1a and 1b having different arrangements of electrodes to prevent upper and lower inner leads 3b and 3a from overlapping each other in the case where the electrodes are arranged in a row at the central portion. Further, the object of the present invention to obtain the plastic-molded-type semiconductor device which is of a high integration type and has an excellent efficiency of the assembling operation can be achieved even where the electrodes on the circuit-forming surface of the semiconductor chips are disposed at other desired position than the outer peripheral portion and the central portion of the semiconductor chip.

Figure 11:
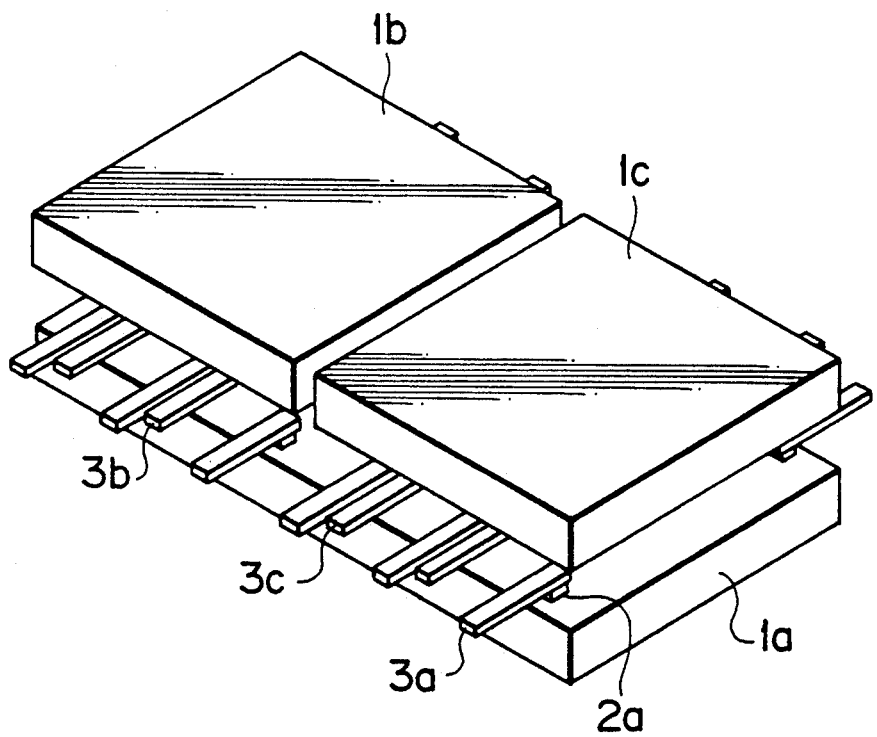
FIG. 11 is a perspective view showing the manner of lamination of semiconductor chips in a plastic-molded-type semiconductor device according to a further embodiment of the present invention.

FIG. 11 is a perspective view of a plastic-molded-type semiconductor device according to a further embodiment of the present invention, showing a stacked condition of semiconductor chips. In this embodiment, two semiconductor chips 1b and 1c of a smaller size are stacked on a semiconductor chip 1a of a larger size, and inner leads 3a, 3b and 3c are attached to the semiconductor chips 1a, 1b and 1c, respectively. The present invention can be applied to a resin-sealed-type semiconductor device having three or more semiconductor chips, as made clear in this embodiment. The lower semiconductor chip 1a in FIG. 11 may be divided into two like the upper semiconductor chips, in which case the number of the semiconductor chips are four.

Figure 12:
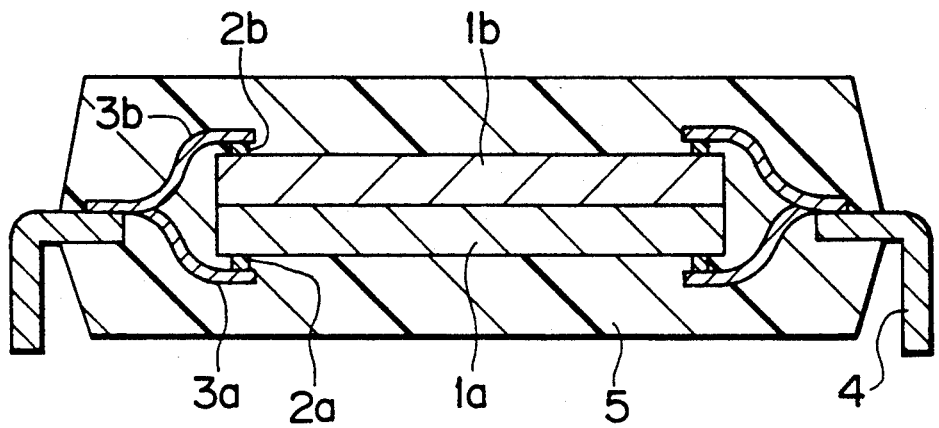
FIGS. 12 and 13 are cross-sectional views of plastic-molded-type semiconductor devices according to further embodiments of the present invention, respectively.
Figure 13:
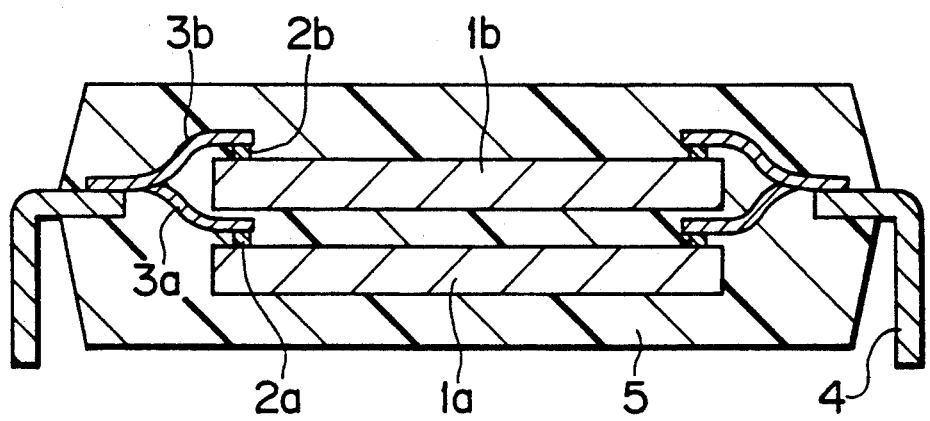

FIGS. 12 and 13 are cross-sectional views of Plastic-molded-type semiconductor devices according to further embodiments of the present invention, respectively. In FIG. 12, non-circuit forming surfaces of two semiconductor chips 1a and 1b are bonded together, and inner leads 3a and 3b, attached respectively to circuit-forming surfaces of the semiconductor chips 1a and 1b, are respectively bent upwardly and downwardly by an amount generally equal to the thickness of one of the semiconductor chips 1a and 1b, and are bonded to one surfaces of outer leads 4, respectively. In FIG. 13, two semiconductor chips 1a and 1b are laminated in such a manner that their circuit-forming surfaces face in the same direction, and upper and lower inner leads 3b and 3b are attached to the two semiconductor chips, respectively, and the upper inner leads 3b or the lower inner leads 3a are bent downwardly or upwardly, or the upper and lower inner leads 3b and 3a are bent downwardly and upwardly, respectively, and are bonded to one surfaces of outer leads 4, respectively.

In the embodiments of FIGS. 12 and 13, also, the bonding of the inner leads 3a and 3b to the outer leads 4 can be carried out only from one side of the lead frame, and the overall thickness of the device can be reduced as compared with the case of using the wire bonding. Further, in the embodiment of FIG. 12, since a good heat transfer is obtained between the two semiconductor chips 1a and 1b, there can be achieved an advantage that a temperature difference between the semiconductor chips 1a and 1b is reduced. In the embodiment of FIG. 13, since the semiconductor chips 1a and 1b face in the same direction, there is no need to provide two kinds of semiconductor chips arranged in mirror-surface symmetrical relation, and besides three or more semiconductor chips can be laminated in a vertical direction.

According to the present invention, since the inner leads of the semiconductor chips ca be all bonded to one surfaces of the outer leads, there can be achieved the advantage that the step of inverting the lead frame is not needed at the lead bonding step, and since the two-split type mold can be used at the sealing step, there can be achieved the advantage that the productivity at the assembling operation is improved.

Further, the inner leads made of a metal foil are disposed at a height generally equal to that of the circuit surface of the semiconductor chip, and are extended horizontally to be bonded to the outer leads. Therefore, there can be obtained the advantage that the thickness of the semiconductor device is reduced.

What is claimed is:

1. A semiconductor device comprising a plurality of semiconductor chips; electrodes formed on circuit surfaces of said plurality of semiconductor chips; inner leads comprised of a metal foil and respectively bonded at first ends thereof to said electrodes; outer leads each having a predetermined surface at a first end thereof bonded to a second end of at least one of said inner leads; and a sealing material sealing said plurality of semiconductor chips, said electrodes, said inner leads, and part of each of said outer leads; wherein said semiconductor chips are laminated in such a manner that those surfaces of said semiconductor chips on which their respective circuits are formed are disposed in facing relation to each other wherein all of the outer leads are part of a lead frame having a first surface facing in a first direction and a second surface facing in a second direction opposite to said first direction, wherein all of the predetermined surfaces of the outer leads are formed on only one of the first and second surface of the lead frame, and wherein the inner leads are connected to the outer leads only at said predetermined surfaces of the outer leads, whereby the inner leads can be connected by bonding between the electrodes of the plurality of semiconductor chips and the outer leads without having to invert the lead frame.

2. A semiconductor device comprising a plurality of semiconductor chips; electrodes formed on circuit surfaces of said plurality of semiconductor chips; inner leads comprised of a metal foil and bonded at first ends thereof to said electrodes; outer leads each having a predetermined surface at a first end thereof bonded to a second end of at least one of said inner leads; and a sealing material sealing said plurality of semiconductor chips, said electrodes, said inner leads, and part of each of said outer leads; wherein said semiconductor chips are laminated in such a manner that those surfaces of said semiconductor chips on which their respective circuits are not formed are disposed in facing relation wherein all of the outer leads are part of a lead frame having a first surface facing in a first direction and a second surface facing in a second direction opposite to said first direction, wherein all of the predetermined surfaces of the outer leads are formed on only one of the first and second surface of the lead frame, and wherein the inner leads are connected to the outer leads only at said predetermined surfaces of the outer leads, whereby the inner leads can be connected by bonding between the electrodes of the plurality of semiconductor chips and the outer leads without having to invert the lead frame.

3. A semiconductor device comprising a plurality of semiconductor chips; electrodes formed on circuit surfaces of said plurality of semiconductor chips; inner leads comprised of a metal foil and bonded at one ends thereof to said electrodes; outer leads each having a predetermined surface at a first end thereof bonded to a second end of at least one of said inner leads; and a sealing material sealing said plurality of semiconductor chips, said electrodes, said inner leads, and part of each of said outer leads; wherein said semiconductor chips are laminated in such a manner that the surface of one of any two adjacent semiconductor chips on which a circuit is formed is disposed in facing relation to that surface of the other semiconductor chip on which a circuit is not formed wherein all of the outer leads are part of a lead frame having a first surface facing in a first direction and a second surface facing in a second direction opposite to said first direction, wherein all of the predetermined surfaces of the outer leads are formed on only one of the first and second surface of the lead frame, and wherein the inner leads are connected to the outer leads only at said predetermined surfaces of the outer leads, whereby the inner leads can be connected by bonded between the electrodes of the plurality of semiconductor chips and the outer leads without having to invert the lead frame.

4. A semiconductor device according to any one of claims 1 to 3, wherein said semiconductor chips are laminated in such a manner that the positions of said semiconductor chips are displaced with respect to each other.

5. A semiconductor device according to any one of claims 1 to 3, wherein two said semiconductor chips having the same circuit construction are laminated, and at least a part of said inner leads of said different semiconductor chips are bonded commonly to said outer leads.

6. A semiconductor device according to claim 1, wherein each of said outer leads has a first surface facing a predetermined side of said semiconductor device, and wherein said predetermined surface of said outer leads is said first surface.

7. A semiconductor device according to claim 1, wherein the sealing material seals the predetermined surface at the first end of each of said outer leads.

8. A semiconductor device according to claim 1, wherein the outer leads have a greater thickness than the inner leads.

9. A semiconductor device according to claim 6, wherein the sealing material seals the predetermined surface at the first end of each of said outer leads.

10. A semiconductor device according to claim 7, wherein the outer leads have a greater thickness than the inner leads.

11. A semiconductor device according to claim 2, wherein each of said outer leads has a first surface facing a predetermined side of said semiconductor device, and wherein said predetermined surface of said outer leads is said first surface.

12. A semiconductor device according to claim 2, wherein the sealing material seals the predetermined surface at the first end of each of said outer leads.

13. A semiconductor device according to claim 2, wherein the outer leads have a greater thickness than the inner leads.

14. A semiconductor device according to claim 11, wherein the sealing material seals the predetermined surface at the first end of each of said outer leads.

15. A semiconductor device according to claim 12, wherein the outer leads have a greater thickness than the inner leads.

16. A semiconductor device according to claim 3, wherein each of said outer leads has a first surface facing a predetermined side of said semiconductor device, and wherein said predetermined surface of said outer leads is said first surface.

17. A semiconductor device according to claim 3, wherein the sealing material seals the predetermined surface at the first end of each of said outer leads.

18. A semiconductor device according to claim 3, wherein the outer leads have a greater thickness than the inner leads.

19. A semiconductor device according to claim 16, wherein the sealing material seals the predetermined surface at the first end of each of said outer leads.

20. A semiconductor device according to claim 17, wherein the outer leads have a greater thickness than the inner leads.

* * * * *